US008633688B2

(12) United States Patent
Paci et al.

(10) Patent No.: US 8,633,688 B2
(45) Date of Patent: Jan. 21, 2014

(54) INTEGRATED MAGNETIC SENSOR FOR DETECTING HORIZONTAL MAGNETIC FIELDS AND MANUFACTURING PROCESS THEREOF

(75) Inventors: Dario Paci, Livorno (IT); Paolo Iuliano, Villa d'Adda (IT); Caterina Riva, Cusago (IT); Marco Morelli, Bareggio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 464 days.

(21) Appl. No.: 12/957,175

(22) Filed: Nov. 30, 2010

(65) Prior Publication Data
US 2011/0210722 A1    Sep. 1, 2011

(30) Foreign Application Priority Data
Nov. 30, 2009    (IT) .............................. TO2009A0936

(51) Int. Cl.
*G01R 33/02*    (2006.01)
(52) U.S. Cl.
USPC ........ 324/252; 324/207.2; 324/244; 324/249; 324/251; 324/253
(58) Field of Classification Search
USPC ......... 324/207.2, 207.21, 252, 251, 244, 249, 324/253, 260, 261, 262, 263; 33/355 R, 33/356; 257/E43.002–E43.007, E27.005; 327/511; 338/32 R, 32 H
See application file for complete search history.

(56) References Cited

U.S. PATENT DOCUMENTS

| 4,772,929 | A | 9/1988 | Manchester |
| 5,942,895 | A | 8/1999 | Popovic et al. |
| 6,341,080 | B1 | 1/2002 | Lienau et al. |
| 6,356,068 | B1 | 3/2002 | Steiner et al. |
| 6,396,114 | B1 * | 5/2002 | Yoshinaga ............. 257/425 |
| 6,404,192 | B1 * | 6/2002 | Chiesi et al. .......... 324/253 |
| 6,545,462 | B2 | 4/2003 | Schott et al. |

(Continued)

FOREIGN PATENT DOCUMENTS

JP    2000-340856 A    12/2000

OTHER PUBLICATIONS

Baschirotto, A. et al., "An Integrated Micro-Fluxgate Magnetic Sensor With Sputtered Ferromagnetic Core," Proceedings of the IEEE Instrumentation and Measurement Technology Conference, pp. 2045-2049, Apr. 24-27, 2006.

(Continued)

*Primary Examiner* — Arleen M Vazquez
*Assistant Examiner* — Son Le
(74) *Attorney, Agent, or Firm* — Seed IP Law Group PLLC

(57) ABSTRACT

The integrated magnetic sensor for detecting an external magnetic field, is formed by a body of semiconductor material having a surface; an insulating layer covering the body of semiconductor material; a magnetically sensitive region, for example a Hall cell, extending inside the body; and a concentrator of ferromagnetic material, extending on the Hall cell and having a planar portion extending parallel to the surface of the substrate on the insulating layer. The concentrator terminates with a tip protruding peripherally from, and transversely to, the planar portion toward the Hall cell. When the magnetically sensitive region is a sensing coil of a fluxgate sensor, it is formed on the substrate, embedded in the insulating layer, and the tip of the concentrator can reach as far as the sensing coil.

26 Claims, 8 Drawing Sheets

(56) References Cited

U.S. PATENT DOCUMENTS

| | | |
|---|---|---|
| 2002/0017902 A1* | 2/2002 | Vasiloiu .................. 324/207.17 |
| 2003/0112158 A1 | 6/2003 | Babin |
| 2003/0207486 A1 | 11/2003 | Deak |
| 2004/0008022 A1 | 1/2004 | Viola et al. |
| 2006/0175674 A1 | 8/2006 | Taylor et al. |
| 2007/0216406 A1* | 9/2007 | Witcraft et al. ............... 324/252 |
| 2010/0134101 A1 | 6/2010 | Riva et al. |
| 2010/0156405 A1* | 6/2010 | Furukawa et al. ............ 324/252 |

OTHER PUBLICATIONS

Cui, Z. et al., "Fabrication of magnetic rings for high density memory devices," Microelectronic Engineering 61-62:577-583, 2002.

Drljaca, P. et al, "Design of planar magnetic concentrators for high sensitivity Hall devices," Sensors and Actuators A 97-08:10-14, 2002.

\* cited by examiner

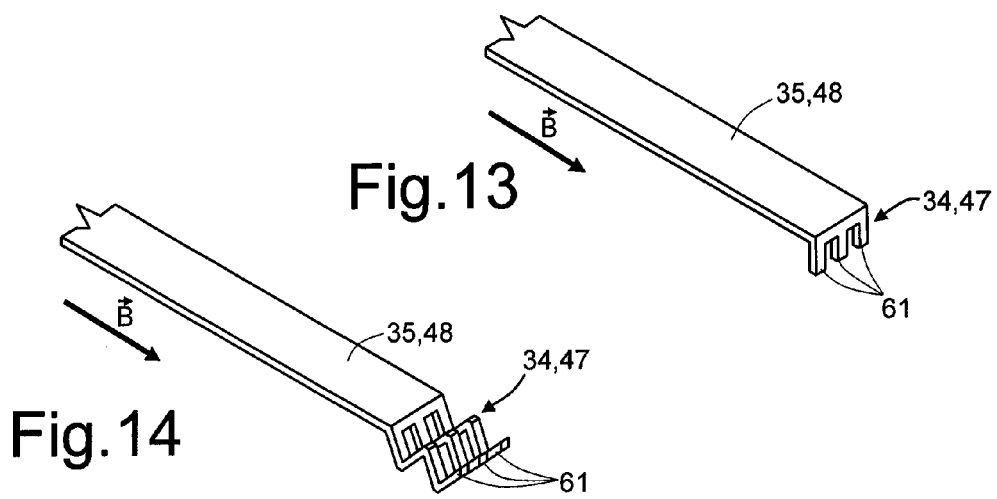
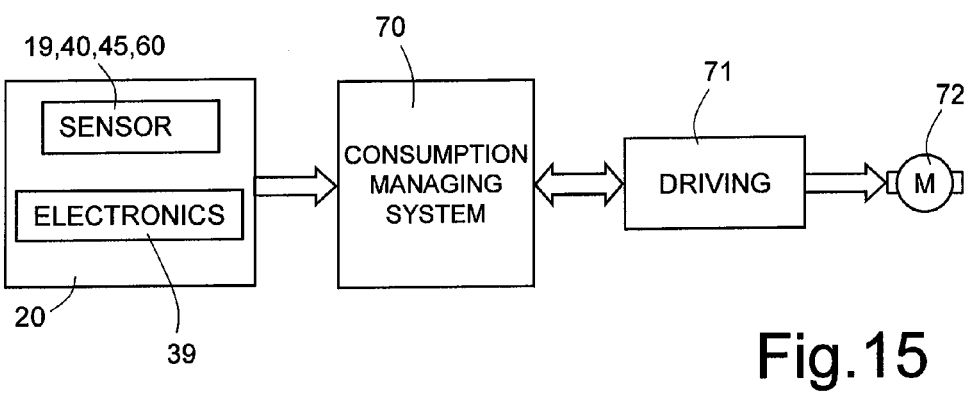
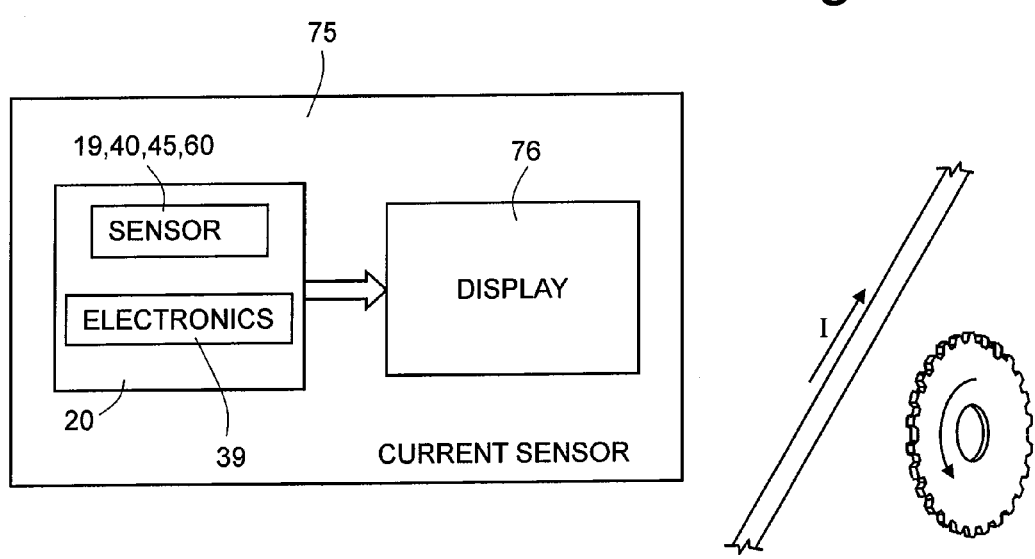

INTEGRATED MAGNETIC SENSOR FOR DETECTING HORIZONTAL MAGNETIC FIELDS AND MANUFACTURING PROCESS THEREOF

BACKGROUND

1. Technical Field

The present disclosure relates to an integrated magnetic sensor for detecting horizontal magnetic fields and manufacturing process thereof. In particular, the disclosure regards an integrated magnetic sensor provided with a magnetic concentrator.

2. Description of the Related Art

As is known, the integration of a thin ferromagnetic layer in a standard CMOS or CMOS-compatible process enables provision of integrated magnetic-field sensors, such as fluxgate sensors and Hall-effect sensors, capable of detecting horizontal magnetic fields.

An example of a fluxgate sensor of a planar type sensitive to external magnetic fields parallel to the surface of a chip is described in U.S. Pat. No. 6,404,192 and shown in FIG. 1. The sensor 1 comprises a magnetic core 4, here cross-like shaped, overlying an exciting coil 2, which in turn overlies four sensing coils 3a, 3b, 3c and 3d, arranged on a substrate (not shown). By supplying the exciting coil 2 with an appropriate a.c. excitation current, it is possible to bring each half-arm of the magnetic core 4 into a series of magnetic-saturation cycles that enable modulation and thus identification of the external magnetic field. Sensing of respective components of an external magnetic field that are parallel to the half-arms is obtained via the pairs of sensing coils 3a-3d.

An example of a Hall-effect sensor 9 provided with a concentrator is shown in FIG. 2, wherein a substrate 10 of semiconductor material houses a pair of Hall cells 11. A concentrator 12 extends on the surface of the substrate 10, insulated therefrom via an insulating layer (not shown).

The concentrator 12 is formed by a strip of ferromagnetic material, the ends whereof are vertically aligned to a respective Hall cell 11, obtained in a known way and thus not shown in detail. Moreover this figure shows the lines of flux of an external magnetic field B having a distribution parallel to the surface of the substrate and deviated by the concentrator so as to traverse the Hall cells 11 in a direction perpendicular to the substrate surface and thus so as to enable sensing of the external field by the Hall cells, which are in themselves sensitive only to the components of the field perpendicular to the surface.

Using fluxgate technology it is possible to obtain sensors that are able to measure d.c. or slowly variable magnetic fields having an intensity of between a few µG and a few Gauss, with a high resolution, of the order of nG. In terms of dynamic range and resolution, fluxgate devices are positioned between Hall-effect magnetic-field sensors (which can typically detect fields of between 10 and $10^6$ G) and other types of sensors—such as for example SQUID (Superconducting Quantum Interference Devices) sensors—which can detect fields of between $10^{-10}$ and $10^{-5}$ G.

For low values of magnetic field, fluxgate sensors are to be preferred to Hall-effect sensors on account of their better performance and find a wider application as compared to SQUID sensors, thanks to their lower cost and reduced overall dimensions.

To extend the sensitivity of fluxgate sensors, it has been already proposed to integrate Hall cells in a fluxgate sensor, to obtain a FluxHallGate sensor, as described in U.S. patent application Ser. No. 12/628,448, filed on Dec. 1, 2009, which is incorporated herein by reference in its entirety. In particular (see FIG. 3), a FluxHallGate sensor has the basic structure of the fluxgate sensor 1 of FIG. 1, and Hall cells 6 extend underneath the exciting coils 3a-3d. In FIG. 3, for reasons of simplicity, only two exciting coils 3a, 3b and the corresponding Hall cells 6a, 6b are shown, but the structure may also comprise a second pair of exciting coils (that are the same as the exciting coils 3c, 3d of FIG. 1), having respective Hall cells underneath.

In all these cases, the magnetic core 4 or the concentrator 12 enables an increase in the sensitivity of the sensor, thanks to the capacity of modifying the lines of flux of the magnetic field and concentrating them in proximity of the sensing coils 3a-3d and/or of the Hall-effect sensors 6.

However, current solutions may be improved. In fact, the effectiveness of the magnetic core or concentrator depends upon its distance from the sensitive element. On the other hand, providing the magnetic core or concentrator in proximity of the sensitive element is problematical. In fact, ferromagnetic materials generally contain iron, nickel, cobalt, and other contaminating elements that in some cases may lead to failure of the electronic components associated with the sensor. Consequently, the wafers are processed using dedicated apparatuses after depositing the ferromagnetic material. The greater the number of technological steps executed after deposition of the ferromagnetic material, the greater the number of apparatuses that are used only to process the wafers with magnetic sensors and the higher the costs.

The problems referred to above are all the more serious when the associated read circuit is integrated with the sensor: for example, it would be necessary to have particularly thick oxide layers causing the manufacture of deep vias to be particularly complex on account of the high aspect ratio. In addition, since the ferromagnetic layer generally has a wide area, problems may arise also in positioning the vias. For these reasons, it would be desirable to be able to form the ferromagnetic layer at the end of the manufacturing process, immediately prior to passivation and opening of the pads, but this technological requirement conflicts with the obtaining a high sensitivity.

BRIEF SUMMARY

One embodiment is a magnetic sensor of the type indicated having a sensitivity higher than that of current solutions.

One embodiment is an integrated magnetic sensor that includes a body of semiconductor material having a surface; an insulating layer covering the surface of the body; a magnetically sensitive region extending within the body or on the body; and a concentrator of ferromagnetic material, extending on the magnetically sensitive region and having a planar portion extending substantially parallel to the surface of the body, and an end portion extending transversely from the planar portion toward the magnetically sensitive region.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIGS. 13 and 14 show perspective views of further variants of the tips of the concentrator; and FIGS. 15 and 16 show possible applications of the present magnetic sensor.

DETAILED DESCRIPTION

Figure 4:
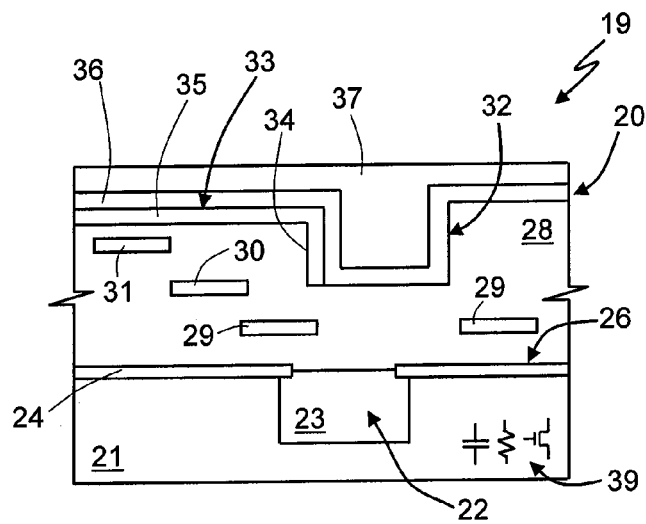
FIG. 4 is a cross-section of a semiconductor material chip integrating a Hall cell with a non-planar concentrator.

FIG. 4 shows an embodiment of a Hall-effect sensor 19 having a non-planar concentrator.

In detail, a chip 20 comprises a substrate 21 of semiconductor material, for example silicon, which accommodates a Hall cell 22 formed in an active area 23. The active area 23, for example a N-type region, is here delimited by a field-insulation region 24 of silicon oxide. Pairs of conductive biasing and sensing regions are formed, in a per se known manner, in areas arranged in front of and behind the drawing plane (and thus not visible).

A dielectric layer 28, for example an oxide layer typically made up of a plurality of superimposed layers, covers the surface 25 of the substrate 21 and accommodates various metallization levels. Visible in the example shown are first metallization regions 29, formed in a first metallization layer, a second metallization region 30, formed in a second metallization layer, and a third metallization region 31, formed in a third metallization layer. Some of the metallization regions 29-31 can be connected, through metal vias, to the conductive biasing and sensing regions of the Hall cell 22 (not shown), in a per se known manner.

Figure 4A:
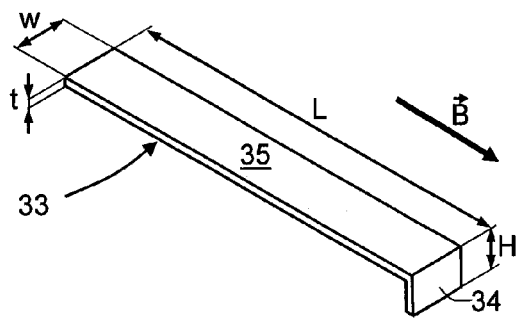
FIG. 4a shows a perspective view of the concentrator of FIG. 4.

The dielectric layer 28 has a trench 32, on a side wall whereof extend a protrusion or tip 34 of a concentrator 33, which is made of ferromagnetic material and has a planar portion 35, as highlighted in the detail of FIG. 4a.

Figure 7A:
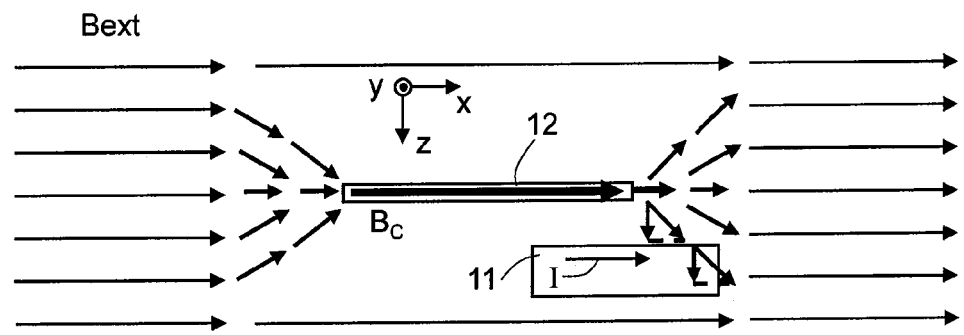
FIGS. 7a and 7b show the distribution of the magnetic field in a Hall cell according to FIG. 2 and according to FIG. 4, respectively.
Figure 7B:
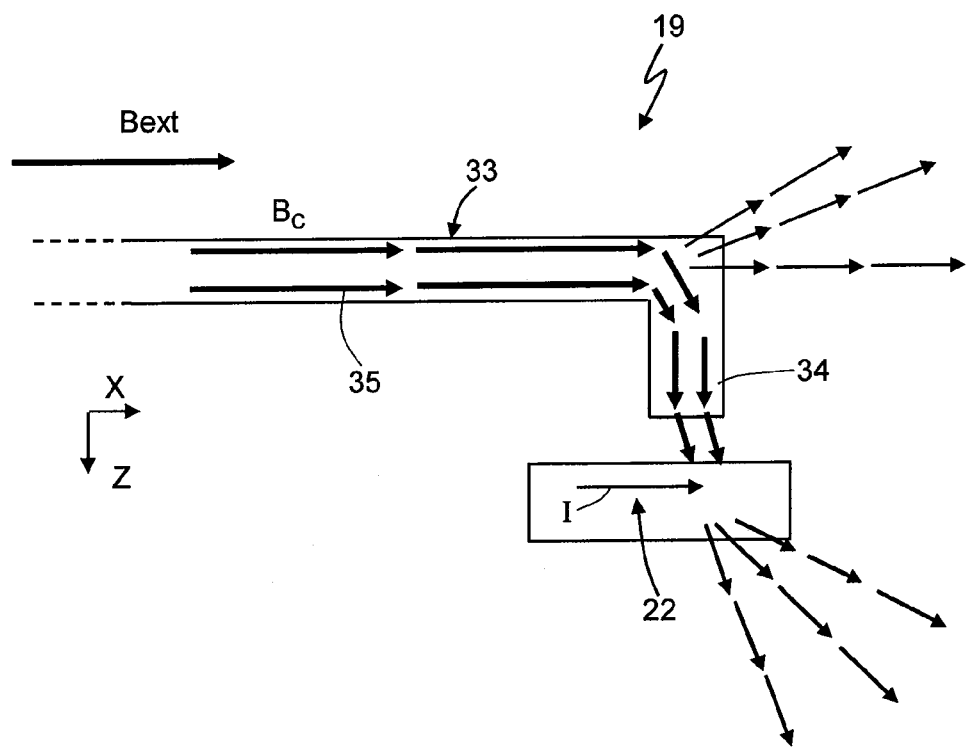

As shown in FIG. 4, the tip extends from the planar portion 35 toward the Hall cell 22, vertically aligned to the Hall cell 22 so as to concentrate the magnetic flux lines toward the Hall cell 22, as shown in FIG. 7b.

In particular, the planar portion 35 is thin; i.e., it has a thickness t (FIG. 4a) much smaller than its dimensions in a direction parallel to the surface 25 of the substrate 21. In the example illustrated, where the planar portion 35 has the shape of an elongated strip, its thickness t is much smaller than its length L and its width W so as to be able to concentrate a high field B oriented in the direction of the length L. The term "much smaller" indicates a ratio of less than 1:8 (L, W>8t), typically less than 1:100. For example, the thickness t can be comprised between 0.5 and 3 μm, the length L can be comprised between 50 μm and 2 mm, for example 200-300 μm.

The tip 34 protrudes from a peripheral area of the planar portion 35 for a height H depending upon the technology used, in particular upon the thickness of the dielectric layer 28, which is, for example, comprised between 2 and 10 μm, typically 3-4 μm, and has the same thickness t as the planar portion 35, being formed starting from the same layer, as explained hereinafter. In any case, the height H should be smaller than the length of the planar portion in the preferential detection direction of the external magnetic field (i.e., in the example shown H<<L), to guarantee the sensitivity in this preferential sensing direction.

The concentrator 33 is, for example, made of a "soft" ferromagnetic material (i.e., one that can be magnetized easily and does not maintain magnetization after the external magnetic field has been removed). For example, a cobalt-based amorphous alloy or a (NiFe) permalloy may be used.

A passivation layer 36 extends on the concentrator 33 and on the uncovered portions of the dielectric layer 28, and thus also in the trench 32. A top insulating layer 37 covers the entire chip.

Electronic components 39 can be integrated in the same chip 20, inside and/or on the substrate 21, under the first metallization level (under the first metallization regions 29). For example, the electronic components 31 can form a read circuit of the Hall cell 22.

The process for manufacturing of the chip 20 is described hereinafter.

Figure 5:
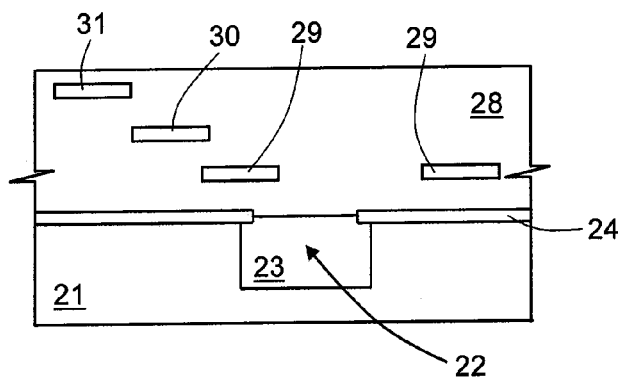
FIGS. 5 and 6 show two cross-sections similar to that of FIG. 4, in two intermediate manufacturing steps.

Initially, inside the substrate 21, the Hall cell 22 and electronic components 39 of the circuitry are provided, in a known way; then the various dielectric insulation layers are formed and the metallization regions 29-31 are provided, in a per se known manner (FIG. 5).

Figure 6:
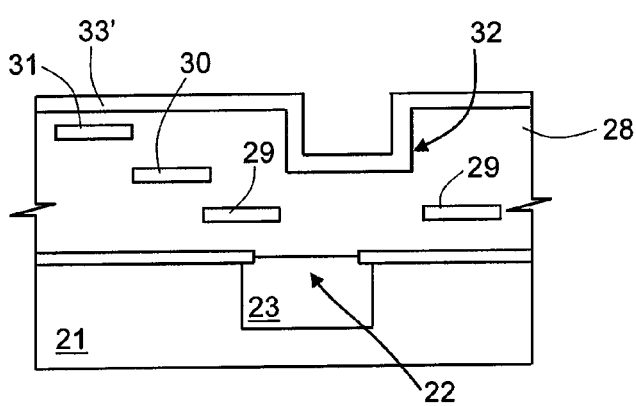

After deposition and planarization of the last dielectric layer for metal insulation, which here covers the third metallization (metallization region 31), the trench 32 is made (FIG. 6). The trench can have a width of between 5 μm and 50 μm, in any case considerably smaller than the length of the planar area 35 of the concentrator, usually only a little smaller than the width of the Hall-effect sensor. In the example illustrated, the trench 32 has substantially vertical walls (perpendicular to the surface of the chip 20 and thus to the surface 25 of the substrate 21); however, it is possible to provide a trench having walls slanted with respect to the vertical (as shown in other embodiments) to simplify the process.

Next, a ferromagnetic material layer 33' designed to form the concentrator 33 is deposited by sputtering.

A photolithographic step is then carried out for defining the concentrator 33. In this step, it is possible to define structures with typical dimensions of the order of 10 μm. The ferromagnetic material layer 33' is then etched, for example via wet etch, dry etch, or lift-off.

Finally, the passivation layer 36 and the top insulating layer 37 are deposited, and contacts are opened toward the pads (not shown).

Figure 2:
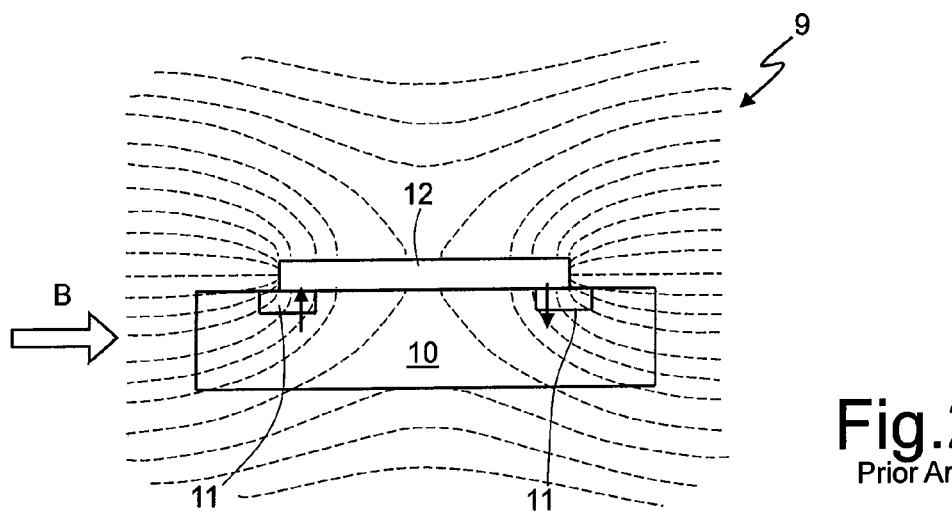
FIG. 2 shows a cross-section of a semiconductor material chip integrating a known Hall-effect sensor with concentrator.
Figure 3:
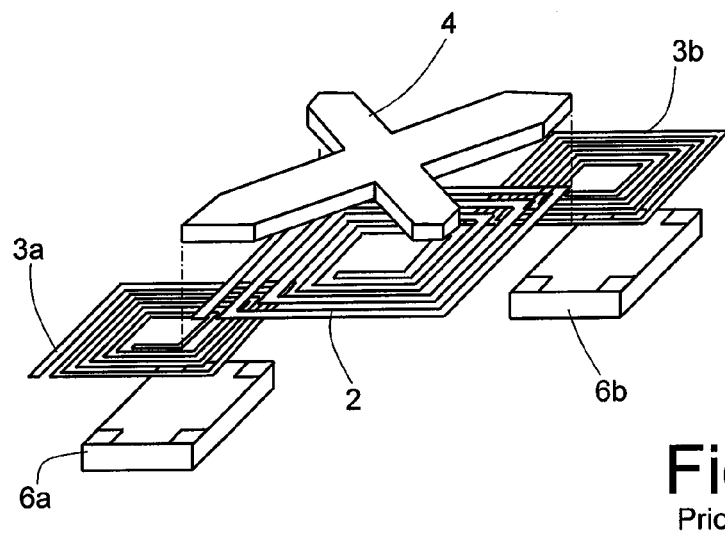
FIG. 3 is a top perspective view of a fluxgate sensor integrating Hall-effect sensors.

For an understanding of operation of the concentrator 33 reference is made initially to FIG. 7a, which illustrates a Hall cell 11 with a planar concentrator 12, of the type shown in FIG. 2. In the example illustrated, where the Hall cell 11 is traversed by a horizontal current I, the cell is sensitive to components of the magnetic field directed along the axis Z (perpendicular to the surface of the substrate 10). In the presence of a field Bext parallel to the plane XY, the concentrator produces a concentrated field Bc, due to the focusing of the lines of flux. At the end of the concentrator 12, on the Hall cell 11, the magnetic-field lines are partially bent so as to have a component along the axis Z and thus be detected by the Hall cell.

Actually, when the magnetic flux exits from one end (here the right-hand end) of the concentrator 12, it is distributed over a greater surface as compared to the inside of the concentrator. This surface increases as the distance from the air/concentrator interface, and thus the concentrator/Hall cell distance, increases. Since it is difficult to obtain the concentrator 12 in proximity of the Hall cell 11, in this solution the sensitivity of the sensor is reduced.

Instead, the concentrator 33 with tip 34 facing the Hall cell "guides" the field toward the Hall cell 22, bringing the concentrated field closer to the Hall cell 32, as shown FIG. 7b, where the thicker lines are associated with a stronger field and the thinner lines are associated with a weaker field. In addition, in proximity of the Hall cell 22, the concentrated magnetic field has a direction only slightly rotated with respect to the direction Z so that the component according to the axis Z of the magnetic field that traverses the Hall cell 22 is to a first approximation equal to the magnitude of the magnetic field. Consequently, the Hall cell 22 has a sensitivity much higher than the Hall cell 11, with a planar concentrator.

Figure 8A:
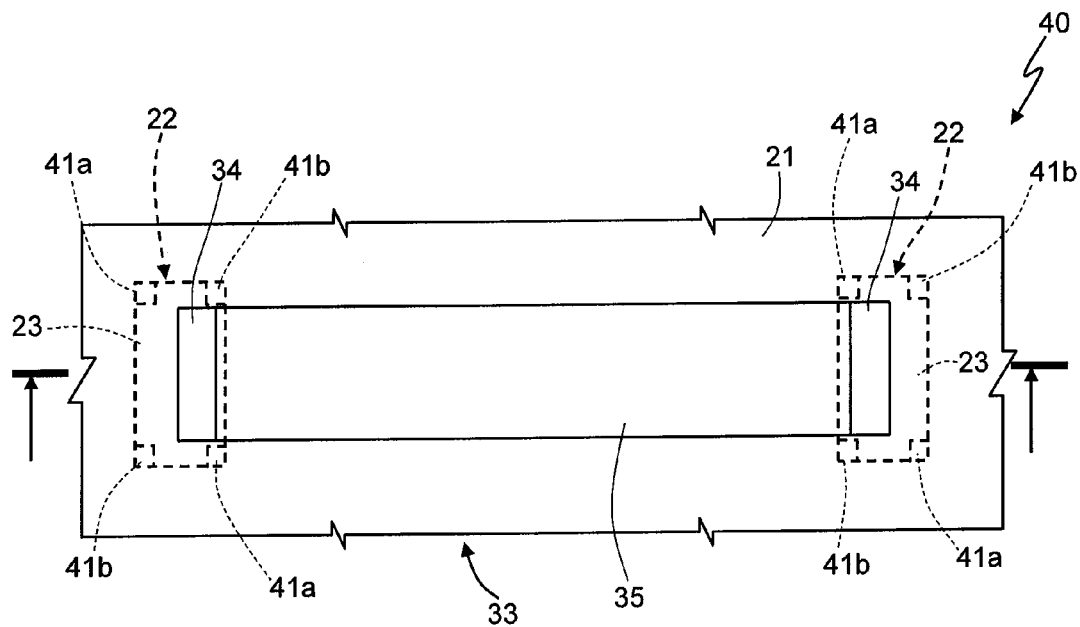
FIGS. 8a and 8b show, respectively, a top plan view and a cross-section of one embodiment of a Hall-effect sensor formed by two cells.
Figure 8B:
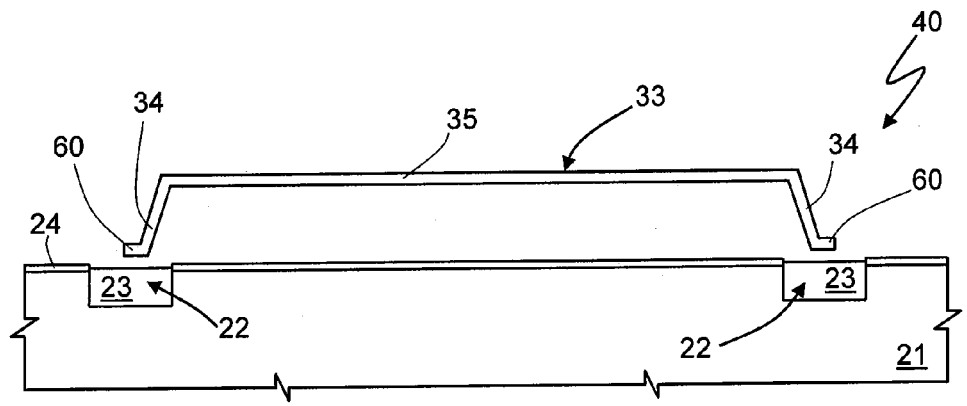

FIGS. 8a and 8b show a Hall-effect sensor 40 formed by a pair of Hall cells 22 arranged underneath a non-planar concentrator. For simplicity, the parts in common with FIG. 4 are designated by the same reference numbers, whereas the layers 28, 36 and 37 and the metallization regions 29-31 are not represented. Here the Hall cells 22 are integrated in the substrate 21 at a distance, insulated from one another by the field-insulation layer 24. The planar portion 35 of the concentrator 33 extends for a length approximately equal to the distance of the two Hall cells 22 and has two tips 34 each overlying a respective Hall cell 22. The top plan view of FIG. 8a moreover shows biasing contacts 41a and sensing contacts 41b, arranged on opposite edges of the active areas 23, in a per se known manner. Here, the tips 34 have horizontal ends 60, extending parallel to the surface 25 of the substrate 21, from the distal ends of the tips 34.

Figure 1:
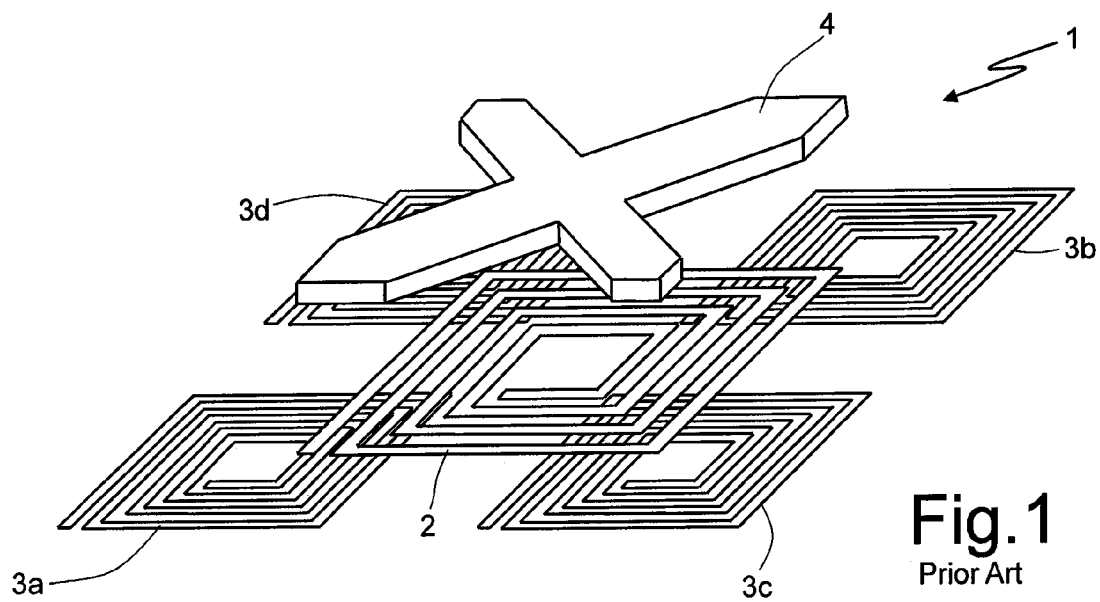
FIG. 1 is a perspective top view of a known fluxgate sensor with two axes of sensitivity.
Figure 9A:
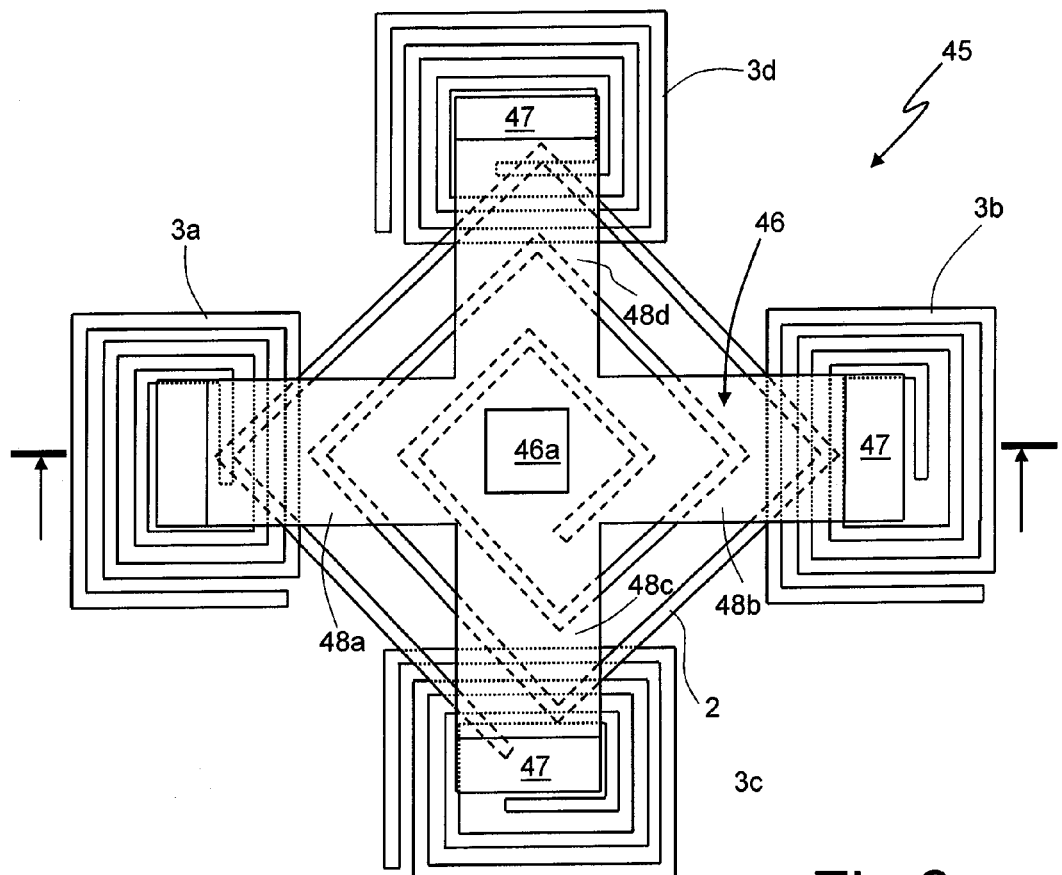
FIGS. 9a and 9b show, respectively, a top plan view and a cross-section of a fluxgate sensor with a non-planar concentrator.
Figure 9B:
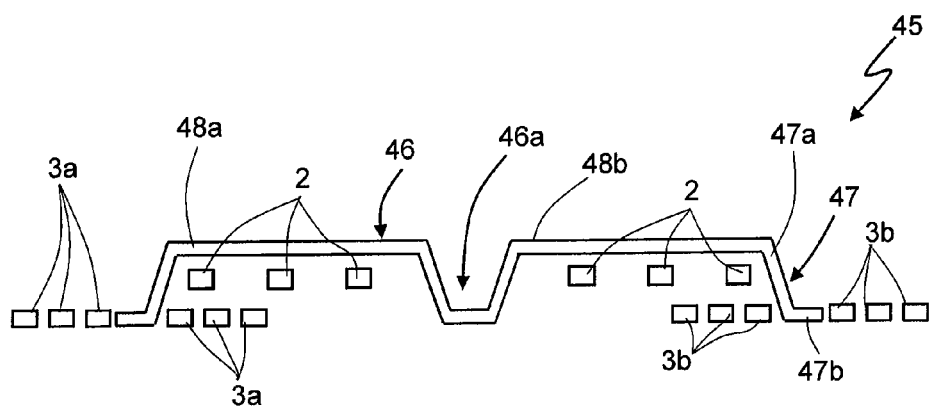

FIGS. 9a and 9b show a fluxgate sensor 45 having a non-planar magnetic core or concentrator. The fluxgate sensor 45 has the basic structure shown in FIG. 1 so that the parts in common with FIG. 1 are designated by the same reference numbers. Here, the magnetic core 46 is embedded in the dielectric layer 28 (not shown) and is also cross-like shaped in top plan view, including four half-arms 48a-48d converging in a central point 46a, which is non-planar, as visible in the cross-section of FIG. 9b, which is the same for both the arms of the magnetic core. The drawing, for clarity, does not show, in addition to the dielectric layer 28, the underlying substrate 21, the planarization layer 36, and the top insulating layer 37, but these are similar to the corresponding elements of FIG. 4.

In detail, each half-arm 48a-48d of the magnetic core 4 terminates with a non-planar protrusion or tip 47, facing a respective sensing coil 3a-3d and traversing the center of the respective sensing coil 3a-3d. Here, the tips 47 are slanted with respect to the vertical and extend laterally with respect to the exciting coil 2 as far as the center of the sensing coils 3a-3d. In the example shown, the tips 47 terminate with horizontal ends 60 that extend each inside a respective sensing coil 3a-3d, without touching it, starting from the distal end of the respective tip 47. Alternatively, the tips 47 may be longer, and protrude underneath the sensing coils 3a-3d and/ or not have the horizontal ends 60. In this case, the horizontal portions 60 would extend in a lower plane than the sensing coils 3a-3d. In the example illustrated, also the central point 46a of the magnetic core 46 is non-planar and extends downwards, traversing the center of the exciting coil 2, approximately as far as the plane defined by the sensing coils 3a-3d. Also the center could, however, protrude beyond the plane of the sensing coils 3a-3d.

In the fluxgate sensor 45, the sensing coils 3a-3d and the exciting coil 2 can be formed in two successive metallization levels, for example in the second and third levels, coplanar with the metallization regions 30, 31 (not shown). Also in this case, the magnetic core 46 is formed on the last envisaged metallization for the considered process, and the manufacturing process includes providing trenches (for example, one for each tip 47 plus one for the central point 46a) and the subsequent deposition and definition of a ferromagnetic layer, followed by depositing the passivation layer and the top insulating layer 37 and opening the pads.

Figure 10A:
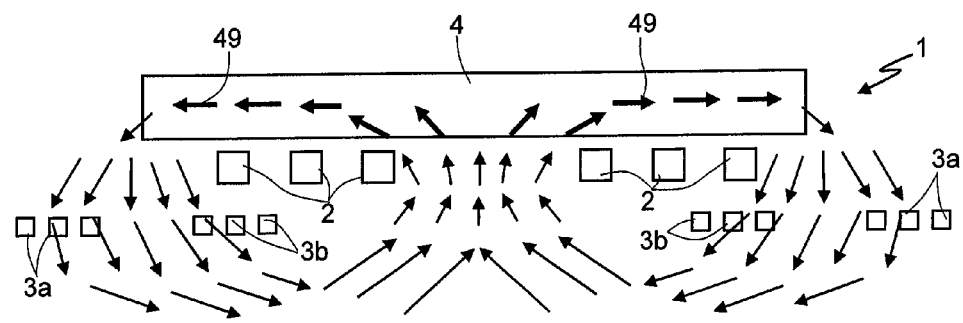
FIGS. 10a and 10b show the distribution of the field in a fluxgate sensor according to FIG. 1 and according to FIGS. 9a and 9b, respectively.
Figure 10B:
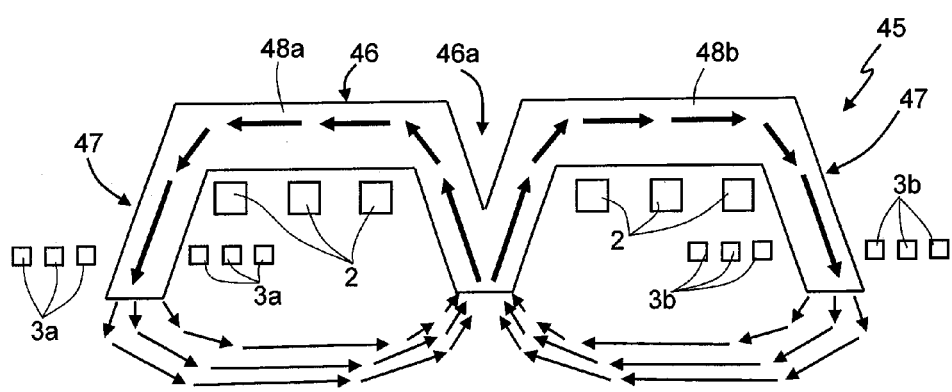

Also in this case, the tips 47 cause a deviation of the lines of flux of the magnetic field acting on the fluxgate sensor 45, as visible from the comparison between FIG. 10a, which shows the qualitative distribution of the lines of flux in one of the two half-arms mutually aligned of the fluxgate sensor 1 of FIG. 1, and FIG. 10b, which shows the qualitative distribution of the lines of flux for example in the two half-arms 48a, 48b of the fluxgate sensor 45 of FIGS. 9a and 9b.

In particular, FIG. 10a shows the field distribution induced by an excitation current that flows in the exciting coil 2 and is able to saturate the magnetic material at an appropriate frequency. In this case, in the absence of an external magnetic field, the mutually aligned half-arms are magnetized in opposite directions, as indicated by the arrows 49, which have opposite directions in the left-hand and in the right-hand halves. As may be noted, the lines of flux are concentrated inside the magnetic core 4, but disperse over a wide area when they come out of the ends thereof.

In the fluxgate sensor 45 of FIG. 10b, application of an equal excitation current to the exciting coil 2 causes generation of a magnetic field, which inside the planar portion of the magnetic core 46 has the same intensity, as indicated by arrows of equal thickness, but has a smaller dispersion outside the magnetic core 46, between the tips 47 and the central point 46a. If the tips 47 terminate under the sensing coils 3a-3d, they even detect the field right in the point where this is most concentrated.

The non-planar fluxgate sensor 45 has a higher sensitivity than the planar fluxgate sensor 1, for same values of the other parameters. In fact, in the absence of an applied external magnetic field, the two sensing coils 3a, 3b experience two equal induced voltages, which have zero value if they are connected in a differential configuration. Instead, when an external magnetic field is present, a first half-arm, for example the half-arm 48b, having magnetization in the same direction as the external magnetic field, undergoes an amplification of its own total magnetization, while the other half-arm 48a is magnetized in an opposite direction and thus its overall magnetization is reduced. Consequently, the differential voltage of the sensing coils 3a, 3b is non-zero. In addition, the differential voltage, which is amplitude-modulated by the intensity of the external field, is higher in the case of the fluxgate sensor 45 having a non-planar magnetic core 46 as compared to the fluxgate sensor 1 having a planar magnetic core 4, by virtue of the focusing of the magnetic flux inside the sensing coils 3a-3d, which thus "see" a magnetic field of greater amplitude.

The same considerations apply to the other half-arms 48c, 48d of the magnetic core 46, which enable detection of magnetic fields oriented in a direction perpendicular to the drawing plane of FIGS. 10a, 10b.

In addition, with the fluxgate sensor 45 of FIGS. 9a, 9b the magnetic flux is guided in the vertical parts of the magnetic core 46, rendering saturation thereof easier and avoiding spreading of the lines of magnetic flux into the air. This enables reduction in the current to be injected into the exciting coils and thus in the power necessary for saturation of the magnetic core 46.

Figure 11:
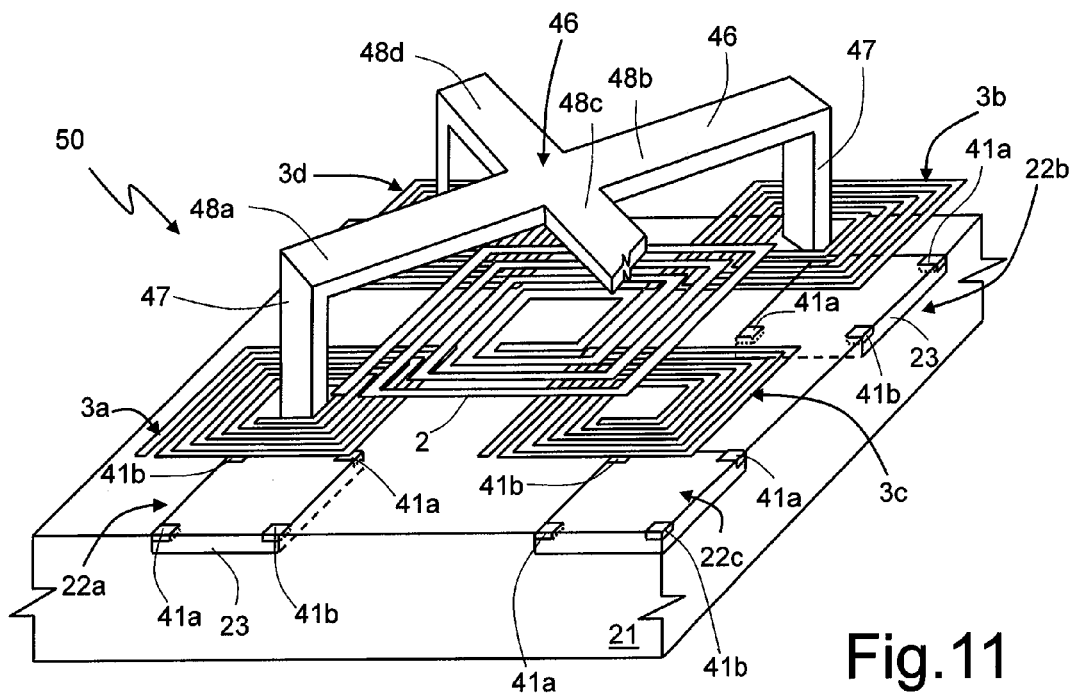
FIG. 11 shows a perspective view of an embodiment of a fluxgate sensor with Hall cells and the present concentrator.

FIG. 11 shows a FluxHallGate sensor 50 provided with a non-planar magnetic core 46 similar to that of FIGS. 9a, 9b and moreover including Hall cells 22a-22d, according to the teachings of U.S. patent application Ser. No. 12/628,448 referred to above. In FIG. 11, for clarity, only a first arm 48a, 48b of the magnetic core 46 is shown completely, the tips 47 whereof extend toward the corresponding Hall cells 22a, 22b, passing through the sensing coils 3a, 3b. However, also the second arm 48c, 48d, arranged in a direction perpendicular to the first and represented only partially, has the same structure and is thus provided with tips 47 protruding toward the respective Hall cells through the respective sensing coils. In addition, for simplicity, the central point 46a of the magnetic core is represented as being planar, but could extend also toward the substrate 21. Also here, FIG. 11 does not show for clarity the dielectric layer 28, the planarization layer 36, and the top insulating layer 37, but these are similar to the corresponding elements of FIG. 4.

In the case of the FluxHallGate sensor 50 of FIG. 11 the advantages set forth above as regards the Hall cells 22 and the fluxgate sensor 45 add up.

FIGS. 12a-12e and 13 show variants in the shape of the tips 34, 47.

Figure 12A:
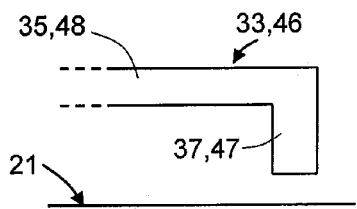
FIGS. 12a-12e show possible shape variants of the tips of the non-planar concentrator associated to the sensors of FIGS. 4-11.

In FIG. 12a, the tip 34, 47 is vertical (perpendicular to the planar portion 35, 48 and thus to the surface 25 of the substrate 21) and terminates with a surface parallel to the planar portion 35, 48.

Figure 12B:
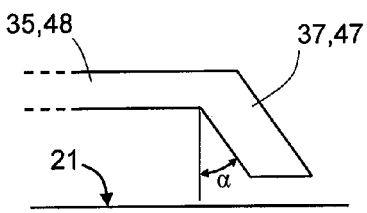

In FIG. 12b, the tip 34, 47 has a non-zero angle α with respect to the vertical and terminates with a surface parallel to the planar portion 35, 48. The angle between the vertical and the direction of the tip 34, 47 can be chosen as a compromise between the best concentration of the field in the sensing point in the case of vertical direction and the greatest ease of production in the case of slanted wall of the trench adjacent to the tip 34, 47 (trench 32 in FIG. 4). For example, the angle α can assume a value of between 0° and 45°.

Figure 12C:
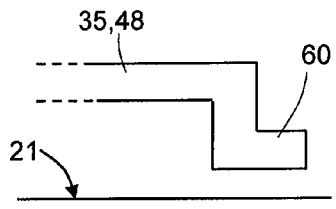

In FIG. 12c, the tip 34, 47 is vertical, but terminates with a horizontal end 60 parallel to the planar portion 35, 46 and thus to the surface 25 of the substrate 21. In this case, the lithographic definition process is simplified. For example, the horizontal end 60 can have a length (in a direction parallel to the main extension of the concentrator or arm of the magnetic core 46) of 5-10 µm and in any case less than the length of the Hall cells 22 and/or the width of the innermost turn of the sensing coil 3, in the case of the fluxgate sensor 45 or 50.

Figure 12D:
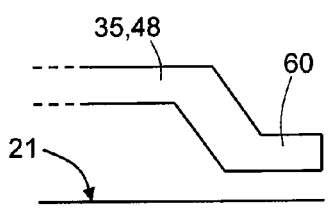

In FIG. 12d, the tip 34, 47 has a non-zero angle α with respect to the vertical and terminates with a horizontal end 60 similar to the one of FIG. 12c.

Figure 12E:
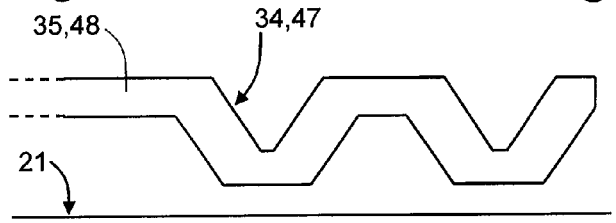

In FIG. 12e the tip 34, 47 has various portions slanted downwards and upwards, in succession, so as to form, in cross-section, a series of adjacent Vs, possibly connected by horizontal portions. This configuration may be useful in certain applications for optimizing the distribution of the magnetic field, and possibly the sensitivity.

In FIG. 13, the tip 34, 47 is vertical, but is formed by a plurality of teeth 61 parallel to one another but arranged at distances in a direction perpendicular both to the planar portion 35, 46 and to the vertical direction.

According to FIG. 14, more tips 61 are provided, each having the shape illustrated in FIG. 12e to form in practice a tip array. Also this configuration can be useful in certain applications for optimizing the distribution of the magnetic field, and possibly the sensitivity.

In all cases, the focusing effect is maximum when the overall dimensions, in top plan view, of each tip 34, 47 are slightly lower than the area of the respective underlying Hall cell, as may be seen in the top plan view in FIG. 8a.

In practice, provision of a non-planar concentrator 33 enables an increase in the sensitivity of a Hall-effect sensor or cell, without any significant increase in the complexity of the manufacturing process. In addition, it is possible to produce the Hall-effect sensor and the concentrator in the same chip as the read circuit, without any risk of contaminating electronic components integrated in the silicon chip.

The use of a three-dimensional magnetic core 46 enables a sensitivity increase also in fluxgate sensors and fluxgate sensors with Hall cells, without introducing particular complexity of fabrication and also in this case without preventing the possibility of integrating electronic components. In addition, in this case it is also possible to obtain a reduction in the power consumption, as explained above.

Finally, it is clear that modifications and variations may be made to the magnetic sensor and to the corresponding manufacturing process described and illustrated herein, without thereby departing from the scope of the present disclosure.

For example, the shape of the planar portion 35 of the concentrator 33 and of the half-arms 48 of the magnetic core 46 can vary with respect to what has been illustrated, and be for example circular, rhomboidal, or of any other shape provided with tips extending in a direction transverse to the planar portion, from a periphery of the latter, toward the Hall cells and/or the sensing coils 3a-3d. The number of the metallization levels can be any whatsoever and depends upon the technology used. In any case, the concentrator extends on the highest metallization level.

The integrated magnetic sensor can be used as current sensor in numerous applications, thanks to its high sensitivity to external magnetic fields and thus to the possibility of being produced separately from the components or structures to be monitored. In fact, since it does not require insertion thereof in the sensing circuit, it does not present insertion losses. Consequently, the present integrated magnetic sensor can be used for detecting the current in power-management systems in the automotive sector, for example in electric motors, the consumption levels whereof are to be controlled, as shown for example in FIG. 14, where the chip 20 integrating the magnetic sensor and the corresponding control and processing circuitry is connected to a unit for managing the consumption levels 70, for example a microprocessor, co-operating with a driving electronics 71 of an electric motor 72.

In addition, the present integrated magnetic sensor can be used for evaluating the rotation angle of North-South magnets or of mechanical members provided with the magnets, such as wheels, gears, encoders, as shown in FIG. 15, wherein the chip 20 is connected to a display 75 of a current sensor 76, possibly provided with further control electronics (not shown).

Finally, the magnetic sensor described can find application in electronic-compass systems.

The various embodiments described above can be combined to provide further embodiments. All of the U.S. patents, U.S. patent application publications, U.S. patent application, foreign patents, foreign patent application and non-patent publications referred to in this specification are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated magnetic sensor for detecting an external magnetic field, comprising:
    a chip including a semiconductor body, having a surface, and an insulating layer covering the surface of the body;
    a magnetically sensitive region extending within the body or on the body; and
    a concentrator of ferromagnetic material extending inside the insulating layer, having a planar portion extending substantially parallel to the surface of the body, and having an end portion extending transversely from the planar portion toward the magnetically sensitive region, wherein the insulating layer comprises a first dielectric layer extending on top of the surface of the body and including a trench, and a second dielectric layer extending on top of the first dielectric layer and in the trench, wherein the concentrator extends between the first and the second dielectric layers and the end portion extends along a lateral side of the trench.

2. An integrated magnetic sensor according to claim 1, wherein the end portion is vertically aligned to the magnetically sensitive region.

3. An integrated magnetic sensor according to claim 1, wherein the end portion is perpendicular to the planar portion.

4. An integrated magnetic sensor according to claim 1, wherein the end portion is slanted with respect to a vertical plane perpendicular to the planar portion.

5. An integrated magnetic sensor according to claim 1, wherein the end portion has a height H and the planar portion has a length L, with H/L being no more than 1/10.

6. An integrated magnetic sensor according to claim 1, wherein the end portion includes a plurality of mutually connected, slanted portions.

7. An integrated magnetic sensor according to claim 1, wherein the end portion includes a plurality of teeth.

8. An integrated magnetic sensor according to claim 1, wherein the concentrator has a smaller thickness in a direction perpendicular to the surface than lateral extension dimensions in directions parallel to the surface.

9. An integrated magnetic sensor according to claim 1, wherein the magnetically sensitive region is a Hall cell integrated in the body and the end portion is vertically aligned to the Hall cell.

10. An integrated magnetic sensor according to claim 1, wherein the insulating layer includes a cavity defined by a side wall that is coated by the end portion of the concentrator.

11. An integrated magnetic sensor according to claim 1, including a Fluxgate sensor having an exciting coil embedded in the insulating layer and under the concentrator, wherein the magnetically sensitive region includes a sensing coil embedded in the insulating layer, the end portion being vertically aligned to the sensing coil.

12. An integrated magnetic sensor according to claim 11, wherein the end portion extends at least to an interior of the sensing coil.

13. An integrated magnetic sensor for detecting an external magnetic field, comprising:
    a chip including a semiconductor body, having a surface, and an insulating layer covering the surface of the body;
    a magnetically sensitive region extending within the body or on the body;
    a concentrator of ferromagnetic material extending inside the insulating layer, having a planar portion extending substantially parallel to the surface of the body, and having an end portion extending transversal from the planar portion toward the magnetically sensitive region, wherein the magnetically sensitive region is a Hall cell integrated in the body and the end portion is vertically aligned to the Hall cell; and
    a plurality of metallization layers embedded in the insulating layer, wherein the planar portion of the concentrator extends above the plurality of metallization layers.

14. An integrated magnetic sensor according to claim 13, wherein the insulating layer comprises a first dielectric layer extending on top of the surface of the body and including a trench, and a second dielectric layer extending on top of the first dielectric layer and in the trench, wherein the concentrator extends between the first and the second dielectric layers and the end portion extends along a lateral side of the trench.

15. An integrated magnetic sensor for detecting an external magnetic field, comprising:
    a chip including a semiconductor body, having a surface, and an insulating layer covering the surface of the body;
    a magnetically sensitive region extending within the body or on the body;
    a concentrator of ferromagnetic material extending inside the insulating layer, having a planar portion extending substantially parallel to the surface of the body, and having an end portion extending transversely from the planar portion toward the magnetically sensitive region; and
    a Fluxgate sensor having an exciting coil embedded in the insulating layer and under the concentrator, wherein the magnetically sensitive region includes a sensing coil embedded in the insulating layer, the end portion being vertically aligned to the sensing coil, wherein the concentrator has a central portion that is non-planar and extends transversely to the planar portion toward the exciting coil; and the planar portion includes a plurality of protrusions mutually connected to the central portion.

16. An integrated magnetic sensor according to claim 15, wherein the end portion extends through the sensing coil.

17. An integrated magnetic sensor for detecting an external magnetic field, comprising:
    a chip including a semiconductor body, having a surface, and an insulating layer covering the surface of the body;
    a magnetically sensitive region extending within the body or on the body; and
    a concentrator of ferromagnetic material extending inside the insulating layer, having a planar portion extending substantially parallel to the surface of the body, and having an end portion extending transversely from the planar portion toward the magnetically sensitive region; and
    a FluxHallgate sensor, wherein the magnetically sensitive region includes a Hall cell integrated in the substrate, the FluxHallgate sensor including an exciting coil embedded in the insulating layer under the concentrator, and a sensing coil arranged on the Hall cell and under the concentrator, wherein the end portion is vertically aligned to the sensing coil and to the Hall cell.

18. An integrated magnetic sensor according to claim 17, wherein the end portion extends through the sensing coil.

19. An apparatus, comprising:
 a control circuit; and
 an integrated magnetic sensor coupled to the control circuit and including:
  a chip including a semiconductor body, having a surface, and an insulating layer covering the surface of the body;
  a magnetically sensitive region extending within the body or on the body;
  a concentrator of ferromagnetic material extending inside the insulating layer, having a planar portion extending substantially parallel to the surface of the body, and having an end portion extending transversely from the planar portion toward the magnetically sensitive region; and
  a Fluxgate sensor having an exciting coil embedded in the insulating layer and under the concentrator, wherein the magnetically sensitive region includes a sensing coil embedded in the insulating layer, the end portion being vertically aligned to the sensing coil, wherein the end portion extends at least to an interior of the sensing coil.

20. An apparatus according to claim 19 configured as a current sensor, a power management system of an electric motor, an electronic compass, or an angular position sensor.

21. An apparatus according to claim 19, wherein the end portion includes a plurality of teeth.

22. An apparatus according to claim 19, wherein the concentrator has a smaller thickness in a direction perpendicular to the surface than lateral extension dimensions in directions parallel to the surface.

23. An apparatus, comprising:
 a control circuit; and
 an integrated magnetic sensor coupled to the control circuit and including:
  a chip including a semiconductor body, having a surface, and an insulating layer covering the surface of the body;
  a magnetically sensitive region extending within the body or on the body;
  a concentrator of ferromagnetic material extending inside the insulating layer, having a planar portion extending substantially parallel to the surface of the body, and having an end portion extending transversely from the planar portion toward the magnetically sensitive region; and
  a Fluxgate sensor having an exciting coil embedded in the insulating layer and under the concentrator, wherein the magnetically sensitive region includes a sensing coil embedded in the insulating layer, the end portion being vertically aligned to the sensing coil, wherein the concentrator has a central portion that is non-planar and extends transversely to the planar portion toward the exciting coil and the planar portions includes a plurality of protrusions mutually connected to the central portion.

24. An apparatus according to claim 23, wherein the end portion extends through the sensing coil.

25. An apparatus, comprising:
 a control circuit; and
 an integrated magnetic sensor coupled to the control circuit and including:
  a chip including a semiconductor body, having a surface, and an insulating layer covering the surface of the body;
  a magnetically sensitive region extending within the body or on the body;
  a concentrator of ferromagnetic material extending inside the insulating layer, having a planar portion extending substantially parallel to the surface of the body, and having an end portion extending transversely from the planar portion toward the magnetically sensitive region; and
  a FluxHallgate sensor, wherein the magnetically sensitive region includes a Hall cell integrated in the substrate, the FluxHallgate sensor including an exciting coil embedded in the insulating layer under the concentrator, and a sensing coil arranged on the Hall cell and under the concentrator, wherein the end portion is vertically aligned to the sensing coil and to the Hall cell.

26. An apparatus according to claim 25, wherein the end portion extends through the sensing coil.

* * * * *